US012632631B2

(12) United States Patent
Mcnairy et al.

(10) Patent No.: US 12,632,631 B2
(45) Date of Patent: May 19, 2026

(54) MAKING CIRCUITRY HAVING AN ATTRIBUTE

(71) Applicant: SiFive, Inc., San Mateo, CA (US)

(72) Inventors: Cameron Mcnairy, Fort Collins, CO (US); Michael Avner Urbach, Denver, CO (US); Colin Schmidt, Mountain View, CA (US)

(73) Assignee: SiFive, Inc., Santa Clara, CA (US)

( * ) Notice: Subject to any disclaimer, the term of this patent is extended or adjusted under 35 U.S.C. 154(b) by 621 days.

(21) Appl. No.: 18/142,087

(22) Filed: May 2, 2023

(65) Prior Publication Data

US 2024/0220693 A1     Jul. 4, 2024

Related U.S. Application Data

(60) Provisional application No. 63/436,153, filed on Dec. 30, 2022.

(51) Int. Cl.
G06F 30/3323 (2020.01)

(52) U.S. Cl.
CPC ................................ G06F 30/3323 (2020.01)

(58) Field of Classification Search
USPC ........................................................ 716/106
See application file for complete search history.

(56) References Cited

U.S. PATENT DOCUMENTS

2005/0268265 A1* 12/2005 Ly ........................ G06F 30/3308
                                                          716/108
2022/0164504 A1*  5/2022 Anisi ..................... G06F 30/327
2024/0220693 A1*  7/2024 Mcnairy ............. G06F 30/3323

* cited by examiner

*Primary Examiner* — Mohammed Alam
(74) *Attorney, Agent, or Firm* — Kilpatrick Townsend & Stockton LLP

(57) ABSTRACT

A system may generate an annotation based on an attribute determined in connection with logic. In some implementations, the logic may be between a first function (e.g., a first point of logic, such as an encoder) and a second function (e.g., a second point of logic, such as a decoder) in a first level circuit representation. The attribute may indicate, for example, fault protection using error correction code, parity, or Gray code, or a power level, frequency domain, or clock domain. The system may then identify circuitry in a second level circuit representation corresponding to the annotated logic in the first level circuit representation. The second level circuit representation may be generated based on the first level circuit representation. The system may then mark the identified circuitry in the second level circuit representation having the attribute. In some implementations, the system may determine a fault profile of an integrated circuit design based on the marking.

20 Claims, 7 Drawing Sheets

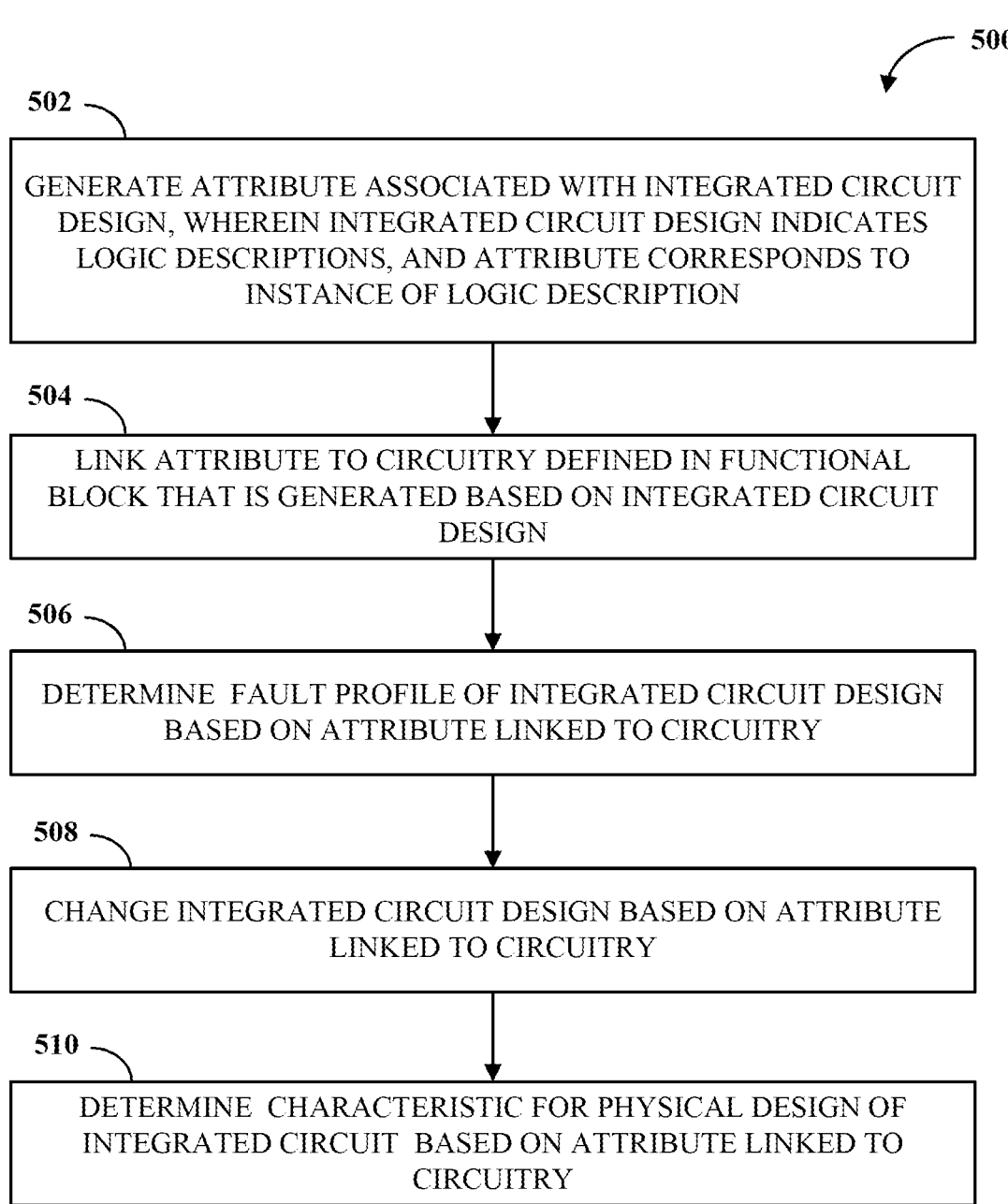

502

GENERATE ATTRIBUTE ASSOCIATED WITH INTEGRATED CIRCUIT DESIGN, WHEREIN INTEGRATED CIRCUIT DESIGN INDICATES LOGIC DESCRIPTIONS, AND ATTRIBUTE CORRESPONDS TO INSTANCE OF LOGIC DESCRIPTION

504

LINK ATTRIBUTE TO CIRCUITRY DEFINED IN FUNCTIONAL BLOCK THAT IS GENERATED BASED ON INTEGRATED CIRCUIT DESIGN

506

DETERMINE FAULT PROFILE OF INTEGRATED CIRCUIT DESIGN BASED ON ATTRIBUTE LINKED TO CIRCUITRY

508

CHANGE INTEGRATED CIRCUIT DESIGN BASED ON ATTRIBUTE LINKED TO CIRCUITRY

510

DETERMINE CHARACTERISTIC FOR PHYSICAL DESIGN OF INTEGRATED CIRCUIT BASED ON ATTRIBUTE LINKED TO CIRCUITRY

FIG. 5

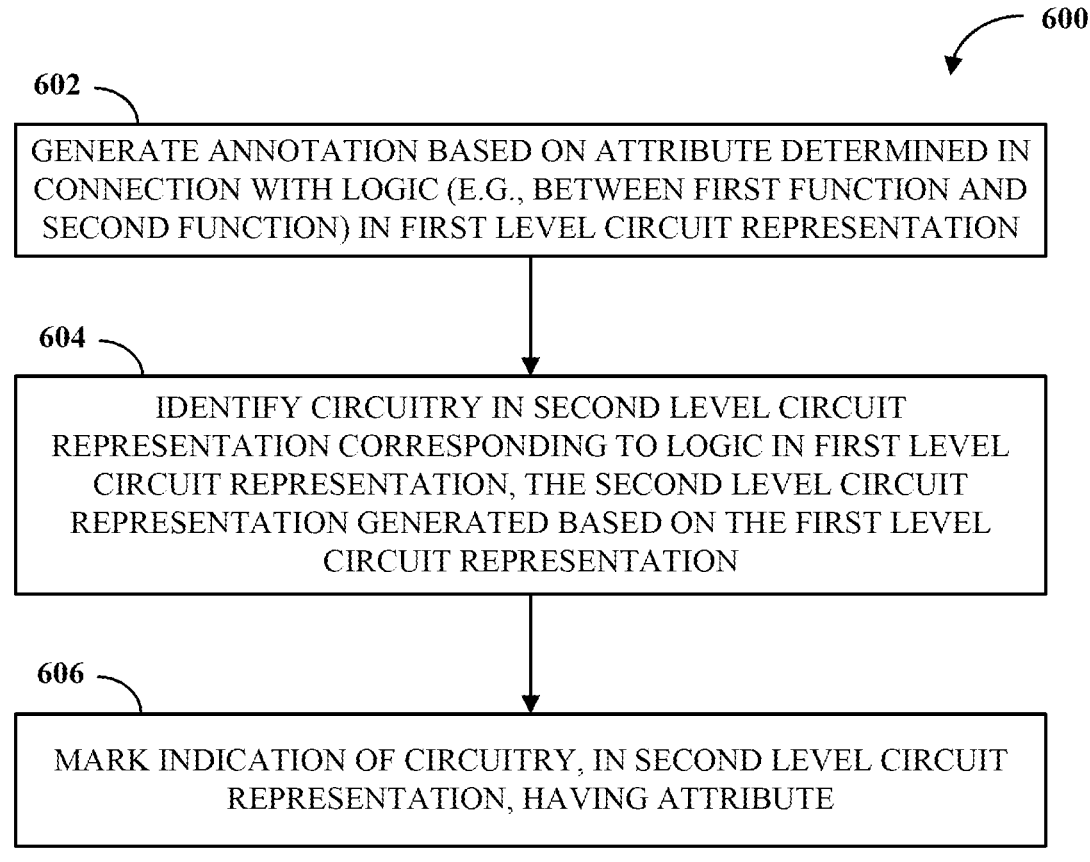

602

GENERATE ANNOTATION BASED ON ATTRIBUTE DETERMINED IN CONNECTION WITH LOGIC (E.G., BETWEEN FIRST FUNCTION AND SECOND FUNCTION) IN FIRST LEVEL CIRCUIT REPRESENTATION

604

IDENTIFY CIRCUITRY IN SECOND LEVEL CIRCUIT REPRESENTATION CORRESPONDING TO LOGIC IN FIRST LEVEL CIRCUIT REPRESENTATION, THE SECOND LEVEL CIRCUIT REPRESENTATION GENERATED BASED ON THE FIRST LEVEL CIRCUIT REPRESENTATION

606

MARK INDICATION OF CIRCUITRY, IN SECOND LEVEL CIRCUIT REPRESENTATION, HAVING ATTRIBUTE

FIG. 6

MAKING CIRCUITRY HAVING AN ATTRIBUTE

CROSS-REFERENCE TO RELATED APPLICATION(S)

This application claims priority to and the benefit of U.S. Provisional Patent Application Ser. No. 63/436,153, filed Dec. 30, 2022, the entire disclosure of which is hereby incorporated by reference.

TECHNICAL FIELD

This disclosure relates generally to integrated circuits, and more specifically, to marking circuitry having an attribute.

BACKGROUND

In some computing environments, reliability in a system must be maintained at a high level as compared to typical computing environments, such as personal computers. For example, in some applications, such as applications involving Automotive Safety Integrity Level D (ASIL D), referring to a classification of hazard defined within ISO 26262 ("Road vehicles—Functional safety"), performance may be sacrificed to maintain reliability at a required level.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

FIG. 5 is a flow chart of an example of a process for linking an attribute associated with an integrated circuit design to circuitry generated based on the design.

FIG. 6 is a flow chart of an example of a process for marking circuitry having an attribute.

DETAILED DESCRIPTION

Figure 1:
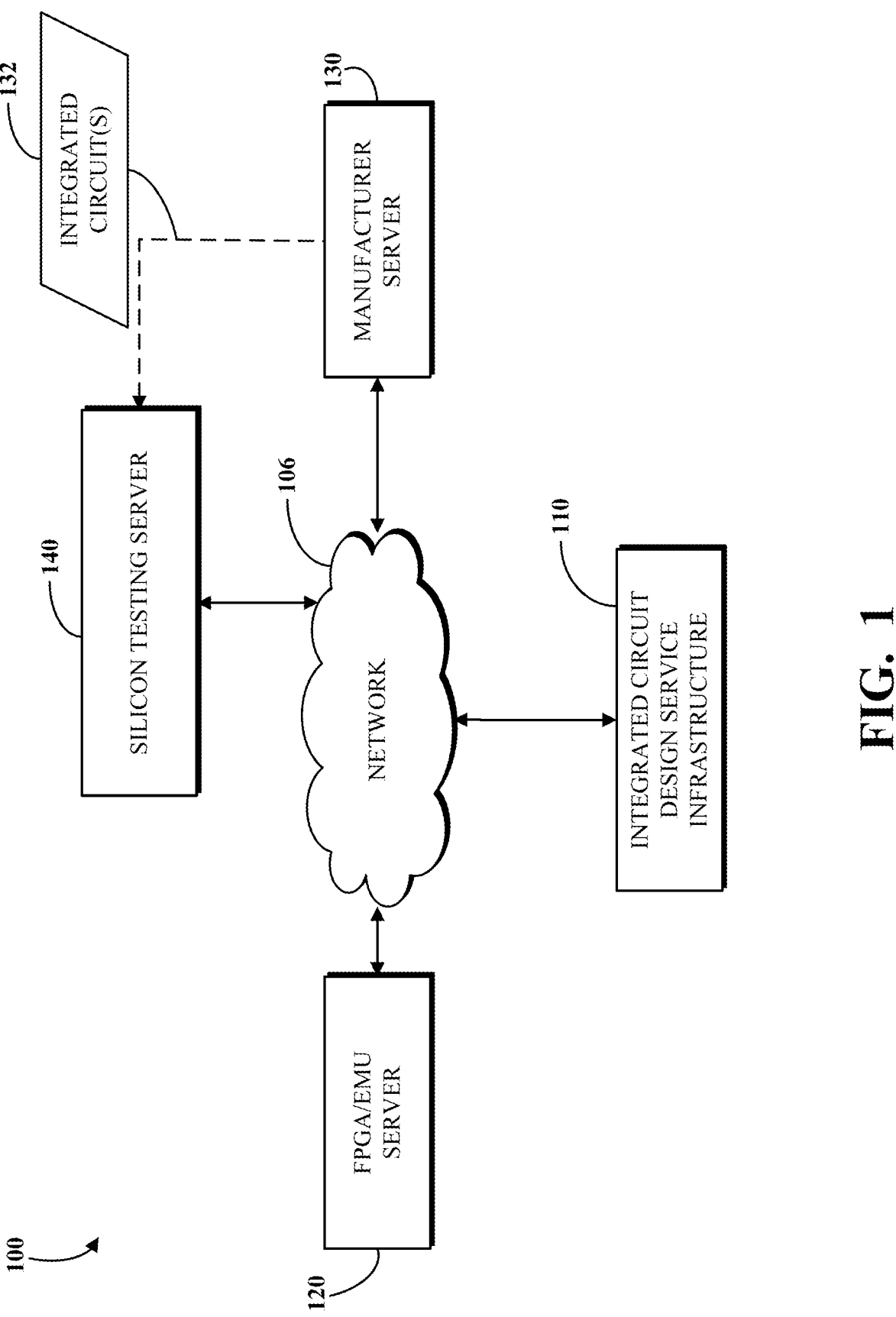
FIG. 1 is a block diagram of an example of a system for facilitating generation and manufacture of integrated circuits.

Automated generation of integrated circuit designs permits a configuration of an application specific integrated circuit (ASIC) or a system-on-a-chip (SoC) to be specified in terms of design parameters. A system may then automate the operation of commercial electronic design automation (EDA) tools for design of the integrated circuit using the design parameters.

For example, a system may execute an integrated circuit generator (or simply a generator) to access design parameters and generate an integrated circuit design. In some implementations, the generator may use a hardware description language (HDL) embedded in a general-purpose programming language (e.g., Scala) that supports object-oriented programming and/or functional programming. For example, Chisel, an open source HDL embedded in Scala, a statically typed general purpose programming language that supports both object-oriented programming and functional programming, may be used to generate an integrated circuit design. The generator may include logic descriptions that specify input(s), output(s), and/or a description(s) of a functional operation of a module (e.g., a processor core, cache, or the like, which may be represented, for example, by a Scala class).

In a process referred to as elaboration, the generator may execute to generate an integrated circuit design based on the design parameters. The integrated circuit design may include instances of logic descriptions (e.g., processor cores, caches, and other structures) with connections being made. For example, the generator may execute constructor code to establish instances of Scala classes, with wired connections between them, as an instantiation of an integrated circuit design. In some implementations, the integrated circuit design may be encoded in an intermediate representation (IR) data structure. The IR data structure may be configured for optimization and/or translation by a compiler to produce a register-transfer level (RTL) data structure. For example, the generator may generate the integrated circuit design as a flexible intermediate representation for register-transfer level (FIRRTL) data structure. The FIRRTL data structure may be compiled by a FIRRTL compiler to produce an RTL data structure.

In a process referred to as compilation, the elaborated integrated circuit design (e.g., the IR data structure) may be compiled to generate the RTL data structure. For example, compiling the integrated circuit design may comprise executing one or more lowering transformations (e.g., compiler transformations that remove high-level constructs) to transform the integrated circuit design to generate the RTL data structure. The RTL data structure may encode a topology of logic associated with the instances of logic descriptions implemented in the integrated circuit design (e.g., logic descriptions of the modules, such as the processor cores, caches, and other structures). The RTL data structure may be compatible with EDA tools that may be used for functional verification (e.g., simulation analysis), synthesis (e.g., conversion to a gate-level description), placement and routing (e.g., physical design), and/or manufacturing of an integrated circuit (e.g., a processor, a microcontroller, an ASIC, or an SoC). In some implementations, the RTL data structure may comprise Verilog. For example, the integrated circuit design may be compiled using a FIRRTL compiler to generate Verilog.

Fault-tolerance may be a priority in some computing environments. A fault may refer to an underlying condition that causes an error. For example, a bit that is stuck at a particular value may produce incorrect results at times, comprising the error. An error may refer to observably incorrect data or an observably incorrect state. The cause of an error may be a fault, and the error itself may result in a failure. A failure may refer to an incorrect end state of a system or calculations causing a result or work product to be tainted.

Evaluations of integrated circuit designs may involve determining the probability of a fault occurring and/or determining how a fault may manifest in a system (e.g., to a user). The particular logic design of an integrated circuit may have an impact on the probability of a fault occurring and/or the manifestation of the fault. As a result, analyzing a logic design with respect to the logic mitigations that may be provided (e.g., fault protection using error correction code (ECC), parity, or Gray code) may be a useful part of the design process. However, as logic mitigations for faults expand beyond large and easily identifiable arrays (e.g., ECC protection of caches) to distributed and intermingled structures in the design (e.g., logic and connections between the arrays), identification of which transistors and other circuitry are covered by a logic mitigation may be difficult. Further, the challenge grows as integrated circuit designs increase in size, complexity, and types of logic mitigations that are used.

Implementations of this disclosure are designed to improve evaluations of integrated circuit designs, including with respect to logic mitigations for faults. A system may generate an annotation based on an attribute that is determined for logic, such as a function (e.g., an adder or a data buffer). In some implementations, the logic or function may be between a first function (e.g., a first point of logic, such as an encoder) and a second function (e.g., a second point of logic, such as a decoder) in a first level circuit representation (e.g., a higher level). The attribute may indicate, for example, fault protection using error correction code, parity, or Gray code. In some cases, the attribute may indicate other characteristics, such as a power level, a frequency domain, or a clock domain. The first level circuit representation could be an IR data structure, or an RTL data structure, generated by a language program such as Chisel. The system may then identify circuitry in a second level circuit representation (e.g., a lower level) that corresponds to the annotated logic in the first level circuit representation. The second level circuit representation could be a netlist or a physical design that is generated based on the first level circuit representation (e.g., the IR data structure, or the RTL data structure). The circuitry could include, for example, a plurality of transistors, gates, and/or wires. The system may mark the identified circuitry in the second level circuit representation as having the attribute. For example, the system may mark the circuitry in a data structure (e.g., storing an indication of the attribute linked to the circuitry). In some implementations, the system may determine a profile of the integrated circuit design based on the marking, such as a fault profile. In some implementations, the system may change the logic (e.g., the function, such as the adder or the data buffer) between the first function (e.g., the first point of logic, such as the encoder) and the second function (e.g., the second point of logic, such as the decoder) in the first level circuit representation based on the profile. As a result, the system may enable identifying circuitry in a lower level of the design as having an attribute from a higher level of the design so that the lower level of the design can be analyzed and improved.

In some implementations, the system may improve integrated circuit designs and evaluations, including with respect to logic mitigations and other properties. A system analyzer or tool may be used to link the attribute, such as the type of logic mitigation or protection (e.g., ECC, parity, and gray code), or other property which may be associated with logic in the design, to circuitry in a resulting functional block, such as the netlist or the physical design. In some cases, this may enable the netlist to be segregated and separated based on attributes to enable assessment of a fault profile of the integrated circuit design. The attributes may be determined based on functions (e.g., encode and decode functions) provided in the logic design representation (e.g., the IR data structure, or the RTL data structure). By tracking functions (e.g., the encode and decode functions) in the higher level of the design, the system analyzer can perform an analysis at lower design levels of the design, such as to compute protected circuitry at lower design levels of the design, such as transistors, gates, and/or wires in the design (e.g., those between the encode functions and their corresponding decode functions). Attributes connected to a lowest level of design information, which may involve forward and backward propagation of the attributes, may be captured and represented by the system.

In some implementations, the system may determine attributes associated with an architecture or micro-architecture (e.g., beyond specified encode and decode functions). The system may annotate resulting logic design representations (e.g., the IR or RTL data structure) down to the functional block (e.g., the netlist or physical design). This may enable indicating a scope and span of the information to the lowest level of design information.

In some implementations, the system may annotate points in the integrated circuit design where functions or points of logic, such as encode and decode logic, exists with annotations about the logic, such as a type of protection available by the encoder. This may encompass circuitry (e.g., wires, transistors, and gates) between corresponding functions (e.g., between the encode logic and the corresponding decode logic), which may be counted and associated with the annotations.

In some implementations, an integrated circuit generator (e.g., a logic specification, such as Chisel) may be configured to emit the annotations. For example, using Chisel, the annotations and the IR data structure of the integrated circuit design may be emitted. The system may then invoke a compiler to convert the IR data structure into the RTL data structure (e.g., System Verilog). The system may then invoke a synthesis tool to generate a netlist from the RTL data structure. The system may then invoke a place and route tool to generate a physical design from the netlist. By analyzing the IR data structure, the RTL data structure, the netlist, and/or the physical design, along with the annotations, the system analyzer can evaluate, determine, and improve circuitry in the integrated circuit design.

In some implementations, an integrated circuit design may indicate instances of logic descriptions. For example, the integrated circuit design could be encoded in an IR data structure or an RTL data structure. The attribute may correspond to an instance of a logic description. The attribute may be linked to circuitry defined in a functional block generated based on the integrated circuit design.

To describe some implementations in greater detail, reference is first made to examples of hardware and software structures used to implement a system for marking circuitry having an attribute. FIG. 1 is a block diagram of an example of a system 100 for generation and manufacture of integrated circuits. The system 100 includes a network 106, an integrated circuit design service infrastructure 110 (e.g., integrated circuit generator), a field programmable gate array (FPGA)/emulator server 120, and a manufacturer server 130. For example, a user may utilize a web client or a scripting application program interface (API) client to command the integrated circuit design service infrastructure 110 to automatically generate an integrated circuit design based on a set of design parameter values selected by the user for one or more template integrated circuit designs. For example, the integrated circuit design service infrastructure 110 could include the integrated circuit generator 304 of FIG. 3. The integrated circuit design service infrastructure 110 could generate the IR data structure 306 of FIG. 3

The integrated circuit design service infrastructure 110 may include an RTL service module configured to generate an RTL data structure for the integrated circuit based on a design parameters data structure. For example, the RTL service module may be implemented as Scala code. In another example, the RTL service module may be implemented using Chisel. In another example, the RTL service module may be implemented using a FIRRTL compiler. In another example, the RTL service module may be implemented using Diplomacy. The RTL service module may enable a well-designed chip to be automatically developed from a high level set of configuration settings using a mix of Diplomacy, Chisel, and FIRRTL. The RTL service module may take the design parameters data structure (e.g., a java script object notation (JSON) file) as input and output for specifying an RTL data structure (e.g., a Verilog file) for the chip. For example, the RTL service module could generate the RTL data structure 308 of FIG. 3.

In some implementations, the integrated circuit design service infrastructure 110 may invoke (e.g., via network communications over the network 106) testing of the resulting design that is performed by the FPGA/emulation server 120 that is running one or more FPGAs or other types of hardware or software emulators. For example, the integrated circuit design service infrastructure 110 may invoke a test using a field programmable gate array, programmed based on a field programmable gate array emulation data structure, to obtain an emulation result. The field programmable gate array may be operating on the FPGA/emulation server 120, which may be a cloud server. Test results may be returned by the FPGA/emulation server 120 to the integrated circuit design service infrastructure 110 and relayed in a useful format to the user (e.g., via a web client or a scripting API client).

The integrated circuit design service infrastructure 110 may also facilitate the manufacture of integrated circuits using the integrated circuit design in a manufacturing facility associated with the manufacturer server 130. In some implementations, a physical design specification (e.g., a graphic data system (GDS) file, such as a GDSII file) based on a physical design data structure for the integrated circuit is transmitted to the manufacturer server 130 to invoke manufacturing of the integrated circuit (e.g., using manufacturing equipment of the associated manufacturer). For example, the physical design 312 of FIG. 3 could correspond to the physical design data structure. The manufacturer server 130 may host a foundry tape-out website that is configured to receive physical design specifications (e.g., such as a GDSII file or an open artwork system interchange standard (OASIS) file) to schedule or otherwise facilitate fabrication of integrated circuits. In some implementations, the integrated circuit design service infrastructure 110 supports multi-tenancy to allow multiple integrated circuit designs (e.g., from one or more users) to share fixed costs of manufacturing (e.g., reticle/mask generation, and/or shuttles wafer tests). For example, the integrated circuit design service infrastructure 110 may use a fixed package (e.g., a quasi-standardized packaging) that is defined to reduce fixed costs and facilitate sharing of reticle/mask, wafer test, and other fixed manufacturing costs. For example, the physical design specification may include one or more physical designs from one or more respective physical design data structures in order to facilitate multi-tenancy manufacturing.

In response to the transmission of the physical design specification, the manufacturer associated with the manufacturer server 130 may fabricate and/or test integrated circuits based on the integrated circuit design. For example, the associated manufacturer (e.g., a foundry) may perform optical proximity correction (OPC) and similar post-tape-out/pre-production processing, fabricate the integrated circuit(s) 132, update the integrated circuit design service infrastructure 110 (e.g., via communications with a controller or a web application server) periodically or asynchronously on the status of the manufacturing process, perform appropriate testing (e.g., wafer testing), and send to a packaging house for packaging. A packaging house may receive the finished wafers or dice from the manufacturer and test materials and update the integrated circuit design service infrastructure 110 on the status of the packaging and delivery process periodically or asynchronously. In some implementations, status updates may be relayed to the user when the user checks in using the web interface, and/or the controller might email the user that updates are available.

In some implementations, the resulting integrated circuit(s) 132 (e.g., physical chips) are delivered (e.g., via mail) to a silicon testing service provider associated with a silicon testing server 140. In some implementations, the resulting integrated circuit(s) 132 (e.g., physical chips) are installed in a system controlled by the silicon testing server 140 (e.g., a cloud server), making them quickly accessible to be run and tested remotely using network communications to control the operation of the integrated circuit(s) 132. For example, a login to the silicon testing server 140 controlling a manufactured integrated circuit(s) 132 may be sent to the integrated circuit design service infrastructure 110 and relayed to a user (e.g., via a web client). For example, the integrated circuit design service infrastructure 110 may be used to control testing of one or more integrated circuit(s) 132.

Figure 2:
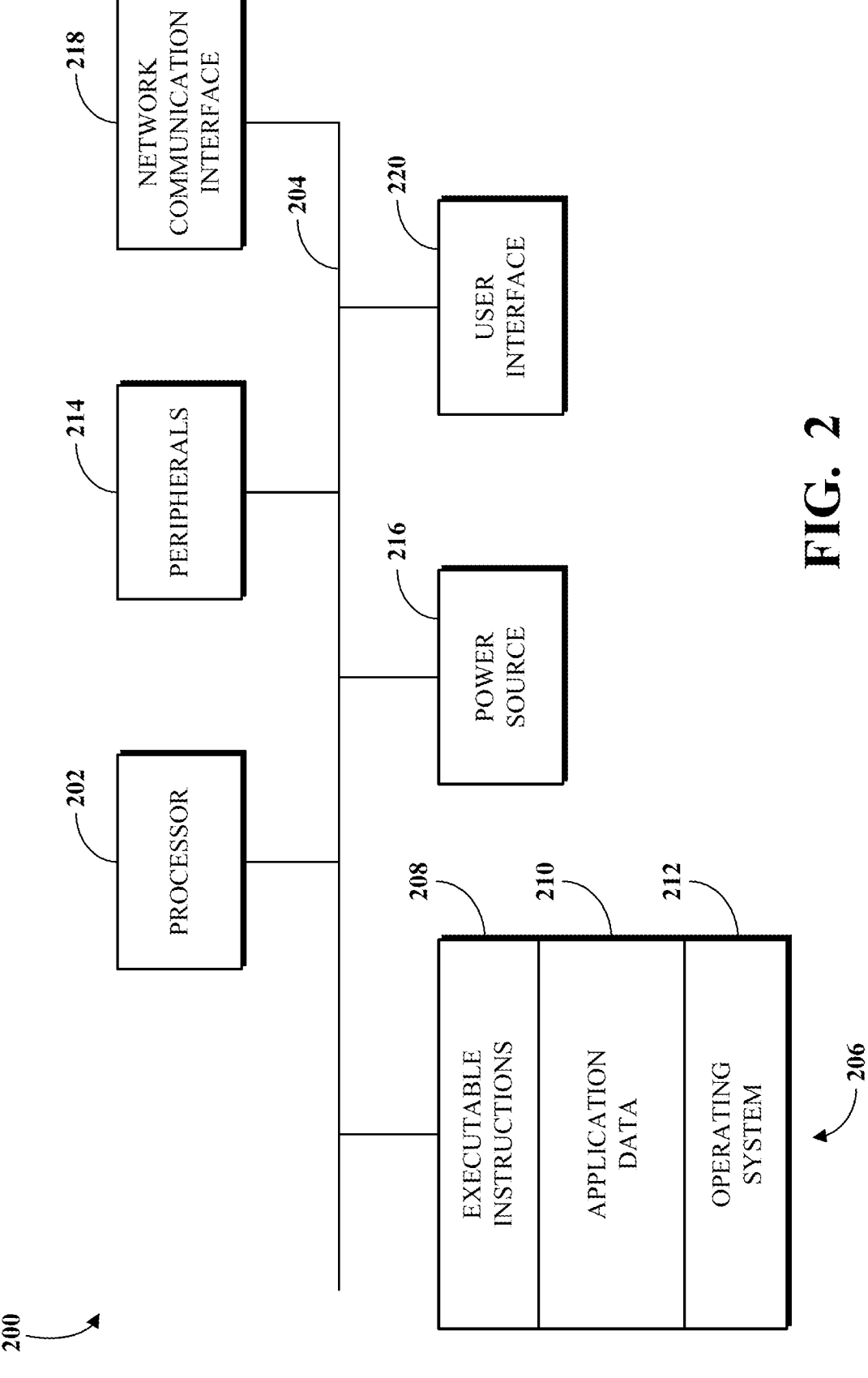
FIG. 2 is a block diagram of an example of a system for facilitating generation of integrated circuits.

FIG. 2 is a block diagram of an example of a system 200 for facilitating generation of integrated circuits, for facilitating generation of a circuit representation for an integrated circuit, and/or for programming or manufacturing an integrated circuit. The system 200 is an example of an internal configuration of a computing device that may be used to implement the integrated circuit design service infrastructure 110, and/or to generate a file that generates a circuit representation of an integrated circuit design. The system 200 can include components or units, such as a processor 202, a bus 204, a memory 206, peripherals 214, a power source 216, a network communication interface 218, a user interface 220, other suitable components, or a combination thereof.

The processor 202 can be a central processing unit (CPU), such as a microprocessor, and can include single or multiple processors having single or multiple processing cores. Alternatively, the processor 202 can include another type of device, or multiple devices, now existing or hereafter developed, capable of manipulating or processing information. For example, the processor 202 can include multiple processors interconnected in any manner, including hardwired or networked, including wirelessly networked. In some implementations, the operations of the processor 202 can be distributed across multiple physical devices or units that can be coupled directly or across a local area or other suitable type of network. In some implementations, the processor 202 can include a cache, or cache memory, for local storage of operating data or instructions.

The memory 206 can include volatile memory, non-volatile memory, or a combination thereof. For example, the memory 206 can include volatile memory, such as one or more dynamic random access memory (DRAM) modules such as double data rate (DDR) synchronous DRAM (SDRAM), and non-volatile memory, such as a disk drive, a solid-state drive, flash memory, Phase-Change Memory (PCM), or any form of non-volatile memory capable of persistent electronic information storage, such as in the absence of an active power supply. The memory 206 can include another type of device, or multiple devices, now existing or hereafter developed, capable of storing data or instructions for processing by the processor 202. The processor 202 can access or manipulate data in the memory 206 via the bus 204. Although shown as a single block in FIG. 2, the memory 206 can be implemented as multiple units. For example, a system 200 can include volatile memory, such as random access memory (RAM), and persistent memory, such as a hard drive or other storage.

The memory 206 can include executable instructions 208, data, such as application data 210, an operating system 212, or a combination thereof, for immediate access by the processor 202. The executable instructions 208 can include, for example, one or more application programs, which can be loaded or copied, in whole or in part, from non-volatile memory to volatile memory to be executed by the processor 202. The executable instructions 208 can be organized into programmable modules or algorithms, functional programs, codes, code segments, or combinations thereof to perform various functions described herein. For example, the executable instructions 208 can include instructions executable by the processor 202 to cause the system 200 to automatically, in response to a command, generate an integrated circuit design and associated test results based on a design parameters data structure. The application data 210 can include, for example, user files, database catalogs or dictionaries, configuration information or functional programs, such as a web browser, a web server, a database server, or a combination thereof. The operating system 212 can be, for example, Microsoft Windows®, macOS®, or Linux®; an operating system for a small device, such as a smartphone or tablet device; or an operating system for a large device, such as a mainframe computer. The memory 206 can comprise one or more devices and can utilize one or more types of storage, such as solid-state or magnetic storage.

The peripherals 214 can be coupled to the processor 202 via the bus 204. The peripherals 214 can be sensors or detectors, or devices containing any number of sensors or detectors, which can monitor the system 200 itself or the environment around the system 200. For example, a system 200 can contain a temperature sensor for measuring temperatures of components of the system 200, such as the processor 202. Other sensors or detectors can be used with the system 200, as can be contemplated. In some implementations, the power source 216 can be a battery, and the system 200 can operate independently of an external power distribution system. Any of the components of the system 200, such as the peripherals 214 or the power source 216, can communicate with the processor 202 via the bus 204.

The network communication interface 218 can also be coupled to the processor 202 via the bus 204. In some implementations, the network communication interface 218 can comprise one or more transceivers. The network communication interface 218 can, for example, provide a connection or link to a network, such as the network 106 shown in FIG. 1, via a network interface, which can be a wired network interface, such as Ethernet, or a wireless network interface. For example, the system 200 can communicate with other devices via the network communication interface 218 and the network interface using one or more network protocols, such as Ethernet, transmission control protocol (TCP), Internet protocol (IP), power line communication (PLC), Wi-Fi, infrared, general packet radio service (GPRS), global system for mobile communications (GSM), code division multiple access (CDMA), or other suitable protocols.

A user interface 220 can include a display; a positional input device, such as a mouse, touchpad, touchscreen, or the like; a keyboard; or other suitable human or machine interface devices. The user interface 220 can be coupled to the processor 202 via the bus 204. Other interface devices that permit a user to program or otherwise use the system 200 can be provided in addition to or as an alternative to a display. In some implementations, the user interface 220 can include a display, which can be a liquid crystal display (LCD), a cathode-ray tube (CRT), a light emitting diode (LED) display (e.g., an organic light emitting diode (OLED) display), or other suitable display. In some implementations, a client or server can omit the peripherals 214. The operations of the processor 202 can be distributed across multiple clients or servers, which can be coupled directly or across a local area or other suitable type of network. The memory 206 can be distributed across multiple clients or servers, such as network-based memory or memory in multiple clients or servers performing the operations of clients or servers. Although depicted here as a single bus, the bus 204 can be composed of multiple buses, which can be connected to one another through various bridges, controllers, or adapters.

A non-transitory computer readable medium may store a circuit representation that, when processed by a computer, is used to program or manufacture an integrated circuit. For example, the circuit representation may describe the integrated circuit specified using a computer readable syntax. The computer readable syntax may specify the structure or function of the integrated circuit or a combination thereof. In some implementations, the circuit representation may take the form of a hardware description language (HDL) program (e.g., the integrated circuit generator 304), a FIRRTL data structure (e.g., the IR data structure 306), an RTL data structure (e.g., the RTL data structure 308), a netlist (e.g., the netlist 310), a GDSII data structure (e.g., the physical design 312), or a combination thereof. In some implementations, the integrated circuit may take the form of an FPGA, an ASIC, an SoC, or some combination thereof. A computer may process the circuit representation in order to program or manufacture an integrated circuit, which may include programming an FPGA or manufacturing an ASIC or an SoC. In some implementations, the circuit representation may comprise a file that, when processed by a computer, may generate a new description of the integrated circuit. For example, the circuit representation could be written in a language such as Chisel, an HDL embedded in Scala, a statically typed general purpose programming language that supports both object-oriented programming and functional programming.

In an example, a circuit representation may be a Chisel language program which may be executed by the computer to produce a circuit representation expressed in a FIRRTL data structure. In some implementations, a design flow of processing steps may be utilized to process the circuit representation into one or more intermediate circuit representations followed by a final circuit representation which is then used to program or manufacture an integrated circuit. In one example, a circuit representation in the form of a Chisel program may be stored on a non-transitory computer readable medium and may be processed by a computer to produce a FIRRTL circuit representation. The FIRRTL circuit representation may be processed by a computer to produce an RTL circuit representation. The RTL circuit representation may be processed by the computer to produce a netlist circuit representation. The netlist circuit representation may be processed by the computer to produce a GDSII circuit representation. The GDSII circuit representation may be processed by the computer to produce the integrated circuit.

In another example, a circuit representation in the form of Verilog or VHDL may be stored on a non-transitory computer readable medium and may be processed by a computer to produce an RTL circuit representation. The RTL circuit representation may be processed by the computer to produce a netlist circuit representation. The netlist circuit representation may be processed by the computer to produce a GDSII circuit representation. The GDSII circuit representation may be processed by the computer to produce the integrated circuit. The foregoing steps may be executed by the same computer, different computers, or some combination thereof, depending on the implementation.

Figure 3:
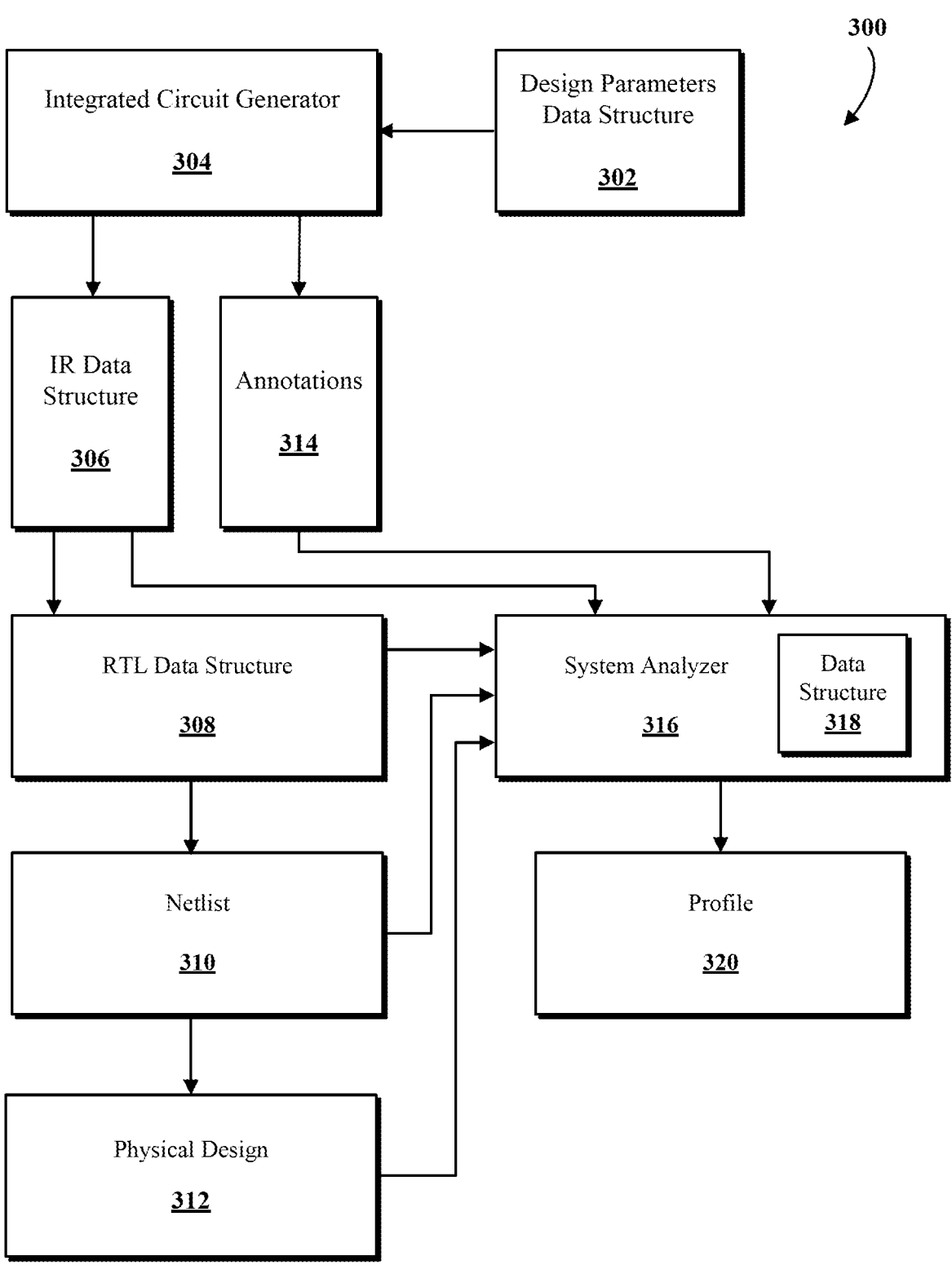
FIG. 3 is a block diagram of an example of a system for marking circuitry having an attribute.

FIG. 3 is a block diagram of an example of a system 300 for marking circuitry having an attribute. For example, the integrated circuit design service infrastructure 110 of FIG. 1 may implement the system 300. The system 300 may include a design parameters data structure 302 and an integrated circuit generator 304. The design parameters data structure 302 (e.g., a design specification, such as a JSON file) may specify parameters for the integrated circuit generator 304. The integrated circuit generator 304 may generate an IR data structure 306, corresponding to the integrated circuit design, based on the parameters from the design parameters data structure 302. The integrated circuit generator 304 may use a language program, such as an HDL embedded in a general-purpose programming language (e.g., Scala) that supports object-oriented programming and/or functional programming. For example, Chisel, an open source HDL embedded in Scala, a statically typed general purpose programming language that supports both object-oriented programming and functional programming, may be used to generate the IR data structure 306. The IR data structure 306 may be an encoding of the integrated circuit design in an intermediate representation (e.g., a FIRRTL data structure), including instances of logic descriptions (e.g., logic associated with processor cores, caches, and other structures) with connections being made between them.

A compiler may be invoked to convert the IR data structure 306 to an RTL data structure 308 corresponding to the integrated circuit design, such as Verilog. For example, the compiler could be a FIRRTL compiler. The RTL data structure 308 may encode a topology of logic associated with the instances of logic descriptions implemented in the integrated circuit design (e.g., logic associated with the modules, such as the processor cores, caches, and other structures). In some implementations, the integrated circuit generator 304 may generate the RTL data structure 308 directly, without generating the IR data structure 306.

A synthesis tool may be invoked to convert the RTL data structure 308 to a netlist 310. The netlist 310 may indicate a description of circuitry and associated connectivity of the integrated circuit design (e.g., a plurality of wires, transistors, and/or gates and their connections). Additional EDA tools may be further invoked with respect to the integrated circuit design, such as a place and route tool for generating a physical design 312 of the integrated circuit design based on the netlist 310, and a functional verification tool for simulation analysis of the physical design 312.

To improve evaluation of the integrated circuit design, the integrated circuit generator 304 can generate annotations 314 based on attributes associated with logic in the integrated circuit design. The integrated circuit generator 304 can determine the attributes for logic, such as a function (e.g., an adder or a data buffer). In some implementations, the logic or function may be between functions (e.g., points of logic, such as encoders and decoders) in the design. For example, the integrated circuit generator 304 may emit the annotations 314 along with the IR data structure 306, which could be a first level circuit representation. The annotations 314 may include attributes that are determined in connection with logic in the design, such as logic in the IR data structure 306. In some cases, the integrated circuit generator 304 may emit the annotations 314 along with the RTL data structure 308, which could then be the first level circuit representation. In such cases, the annotations 314 may include attributes determined in connection with logic in the RTL data structure 308. In some cases, the attribute may indicate a type of fault protection corresponding to the logic. For example, the attribute may indicate a fault protection associated with the logic in the first level circuit representation, such as ECC, parity, or Gray code. In some implementations, the attribute may indicate other characteristics associated with the logic, such as a power level, a frequency domain, or a clock domain associated with the logic in the first level circuit representation.

A system analyzer 316 may receive the integrated circuit design at different levels of the circuit representation. For example, the system analyzer 316 may receive the IR data structure 306, the RTL data structure 308, the netlist 310, and/or the physical design 312. The netlist 310 or the physical design 312 could be a second level circuit representation of the design. The system analyzer 316 may also receive the annotations 314 emitted by the integrated circuit generator 304. The system analyzer 316 may then identify circuitry in the second level circuit representation that corresponds to the annotated logic in the first level circuit representation. For example, the system analyzer 316 may identify circuitry in the netlist 310 or the physical design 312 that corresponds to the logic in the IR data structure 306 or the RTL data structure 308. Based on the identification, the system analyzer 316 may link the attribute from the IR data structure 306 or the RTL data structure 308 to the circuitry in the netlist 310 or the physical design 312. The system analyzer 316 may mark the identified circuitry, in the second level circuit representation, as having the attribute. For example, the system analyzer 316 may mark the circuitry in the netlist 310 or the physical design 312 as having the attribute. In some implementations, the system analyzer 316 may mark the circuitry in a data structure 318 that it maintains.

The system analyzer 316 may then determine a profile 320 of the integrated circuit design based on the marking. For example, the system analyzer 316 may use markings in the data structure 318 to segregate and separate the circuitry of the second level circuit representation based on attributes. This may enable the system analyzer 316 to generate an assessment of the integrated circuit design for the profile 320. In some implementations, the profile 320 may characterize a probability of experiencing a fault. For example, the profile 320 could be a fault profile when the attributes correspond to fault indications. In some implementations, the profile 320 may characterize a probability of exceeding a power or timing envelope. For example, the profile 320 could be a power or timing profile when the attributes correspond to a power level, a frequency domain, or a clock domain. In some implementations, the profile 320 may characterize how a fault in a particular structure of the integrated circuit design may manifest to a user (e.g., observation), and/or a probability of the fault activating in the particular structure (e.g., activation).

Figure 4:
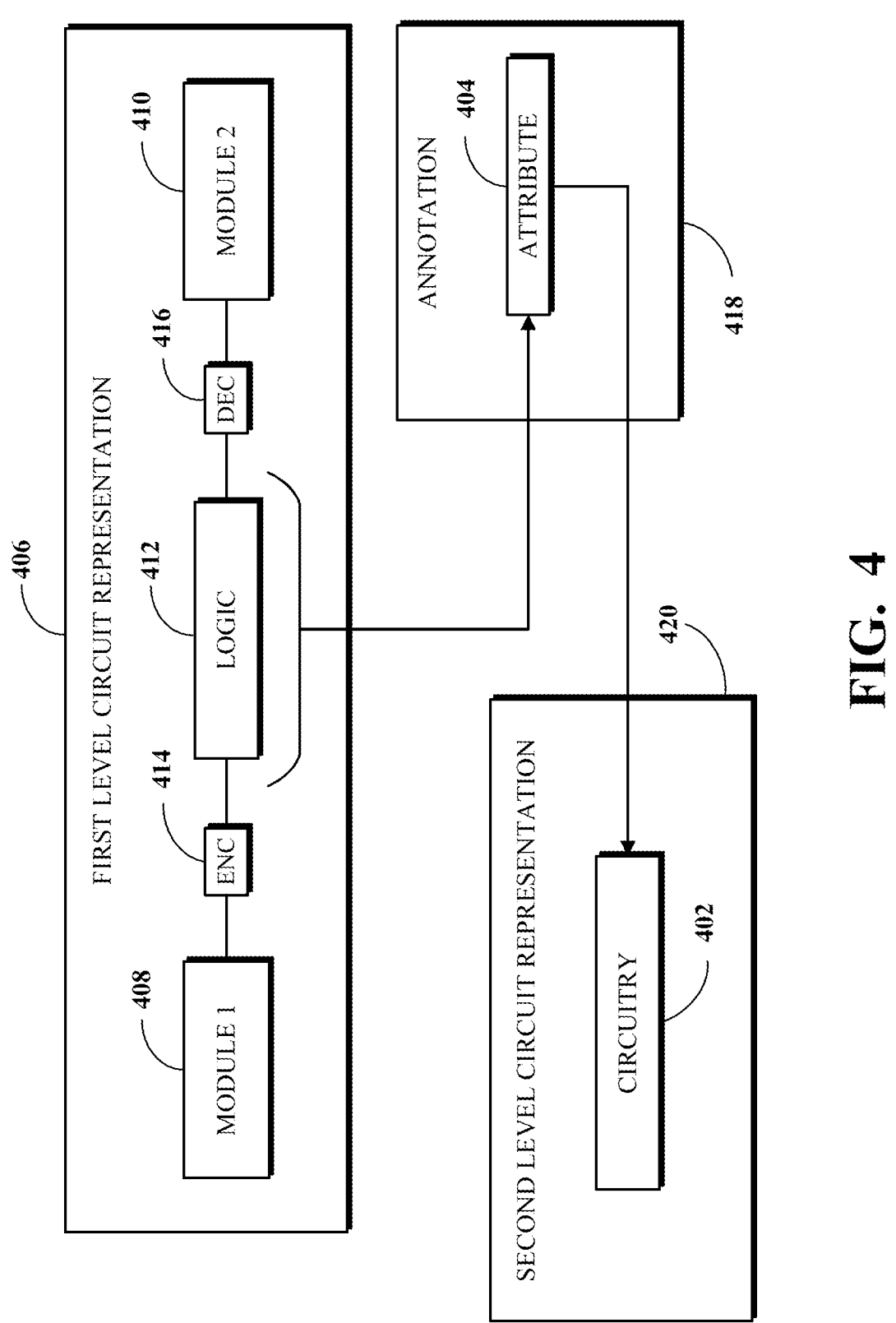
FIG. 4 is a block diagram of an example of marking circuitry having an attribute.

With additional reference to FIG. 4, an example includes a block diagram of marking circuitry 402 having an attribute 404. The system analyzer 316 of FIG. 3 could mark the circuitry 402 as having the attribute 404. The integrated circuit generator 304 may generate a first level circuit representation 406. For example, the first level circuit representation 406 could be the IR data structure 306 or the RTL data structure 308. The first level circuit representation 406 may include instances of logic descriptions, such as a first module 408 connected to a second module 410 via a connection associated with logic 412 (e.g., a logic description). The logic 412 may be configured between a first function, such as an encoder 414, and a second function, such as a decoder 416, in the first level circuit representation 406. In one example, the first module 408 could be a processor core and the second module 410 could be a private cache. For example, the encoder 414 could be used to encode data from the first module 408 (e.g., encoded with redundant information in the form of an ECC, or with a parity bit, or with information to implement Gray code), and the decoder 416 could be used to decode the data from the first module 408 to carry out the fault protection.

The integrated circuit generator 304 may determine the attribute 404 in connection with the logic 412 between the first function and the second function (e.g., between the encoder 414 and the decoder 416). The integrated circuit generator 304 may generate an annotation 418 based on the attribute 404, including when generating the first level circuit representation 406 (e.g., the integrated circuit generator 304 may emit the first level circuit representation 406 and the annotation 418). The system analyzer 316 may then identify the circuitry 402 in a second level circuit representation 420 as corresponding to the logic 412 in the first level circuit representation 406. For example, the second level circuit representation 420 could be the netlist 310 or the physical design 312. The system analyzer 316 may link the attribute 404, from the first level circuit representation 406, to the circuitry 402 in the second level circuit representation 420. The system analyzer 316 may mark the circuitry 402, in the second level circuit representation 420, as having the attribute 404. In some implementations, the system analyzer 316 may mark the circuitry 402 in the data structure 318. The circuitry 402 may correspond to a plurality of wires, transistors, and/or gates that is generated based on the connection associated with the logic 412 between the first function and the second function (e.g., between the encoder 414 and the decoder 416).

For example, for logic mitigation, the system analyzer 316 may annotate a point in the first level circuit representation 406, where the encoder 414 and the decoder 416 exists, with the attribute 404 indicating the type of protection available by the encoder 414 (e.g., ECC, parity, or Gray code). For example, the system analyzer 316 may use the encoder 414 and/or the decoder 416 as reference points. The circuitry 402 in the second level circuit representation 420 may then be identified by the system analyzer 316 locating the circuitry 402 in a functional block that corresponds to the instance of the logic 412 (e.g., using the reference points). When identified, the circuitry 402 (e.g., the plurality of wires, transistors, and gates) can be counted by the system analyzer 316 and linked to the attribute 404. By tracking the encode and decode functions in the design, the system analyzer 316 may perform an analysis (e.g., determine protected transistors, wires, or gates in the functional block) to generate the profile 320.

In some implementations, the integrated circuit generator 304 may determine attributes associated with an architecture or micro-architecture of the integrated circuit design (e.g., beyond specified encode and decode functions), and may annotate resulting logic, down to the functional block, to indicate the scope and span of the information to the lowest level of design information. For example, the first function and the second function could correspond to logic other than encode and decode functions. Thus, the attribute 404 could indicate a power level, a frequency domain, or a clock domain associated with the logic 412, which may be linked to the circuitry 402 in the functional block.

To further describe some implementations in greater detail, reference is next made to examples of methods which may be performed for marking circuitry. FIG. 5 is a flow chart of an example of a process 500 for linking an attribute associated with an integrated circuit design to circuitry generated based on the integrated circuit design. The process 500 can be performed, for example, using the systems, hardware, and software described with respect to FIGS. 1-4. The steps, or operations, of the process 500 or another technique, method, process, or algorithm described in connection with the implementations disclosed herein can be implemented directly in hardware, firmware, software executed by hardware, circuitry, or a combination thereof. Further, for simplicity of explanation, although the figures and descriptions herein may include sequences or series of steps or stages, elements of the methods and claims disclosed herein may occur in various orders or concurrently and need not include all of the steps or stages. Additionally, elements of the methods and claims disclosed herein may occur with other elements not explicitly presented and described herein. Furthermore, not all elements of the methods and claims described herein may be required in accordance with this disclosure. Although aspects, features, and elements are described and claimed herein in particular combinations, each aspect, feature, or element may be used and claimed independently or in various combinations with or without other aspects, features, and elements.

At 502, a system may generate an attribute associated with an integrated circuit design. For example, the integrated circuit generator 304 may be invoked to generate the integrated circuit design, such as by generating an IR data structure (e.g., the IR data structure 306) or an RTL data structure (e.g., the RTL data structure 308). The integrated circuit design may indicate logic descriptions (e.g., processor cores, caches, and other structures, such as the first module 408, the second module 410, the encoder 414, and the decoder 416). The integrated circuit generator can also generate the attribute. The attribute may be generated as an annotation to the integrated circuit design. For example, the integrated circuit generator may generate the annotations 314 which may include the attribute 404, such as the attribute 404. The attribute may correspond to an instance of a logic description, such as the logic 412. In some implementations, the attribute could indicate a type of logic mitigation or protection (e.g., ECC, parity, or Gray code). In some implementations, the attribute could indicate a power level, a frequency domain, or a clock domain.

At 504, the system may link the attribute to circuitry in a functional block that is generated based on the integrated circuit design, such as a netlist or a physical design. For example, the functional block could be a netlist (e.g., the netlist 310) that indicates gate-level connections. A system analyzer (e.g., the system analyzer 316) could link the attribute to circuitry in the netlist. In another example, the functional block could be a physical design (e.g., the physical design 312) of the integrated circuit. The system analyzer could link the attribute to circuitry in the physical design.

The circuitry may correspond to one or more wires, transistors, and/or gates resulting from an instance of a logic description, such as a connection associated with the logic 412, configured between a first function, such as an encoder, and a second function, such as a decoder. The system may determine the circuitry in the functional block by locating the instance of the logic that corresponds to the circuitry in the functional block.

Based on the attribute being carried down to the specific corresponding circuits, various additional steps with respect to the design can be performed. For example, at 506, the system could determine a fault profile (e.g., the profile 320) of the integrated circuit design based on the attribute linked to the circuitry. For example, the functional block could be a netlist that indicates gate-level connections, and the fault profile could be based on logic mitigation or protection of the circuitry specified in the netlist. In some implementations, the fault profile may enable determining a failure in time (FIT) rate for the integrated circuit. A FIT rate may be a measure a number of failures that might occur in one billion hours of operation.

In another example, at 508, the system could change the integrated circuit design based on the attribute linked to the circuitry. For example, the system may generate an output indicating a change to the integrated circuit design. For example, the change could be to improve the fault profile, such as by increasing protection of circuitry which may increase the FIT rate.

In another example, at 510, the system could determine a characteristic for a physical design of the integrated circuit based on the attribute linked to the circuitry (e.g., the functional block could be a physical design of the integrated circuit that is implemented by a place and route tool). Logic mitigation, protection, or other properties of the circuitry, determined by the attribute, could then be used by the place and route tool to determine the characteristic, such as determining an optimum cell (e.g., a more fault robust cell) from a cell library, according to a weight or cost function.

In some implementations, the attribute may be used to support a profile guided optimization for the circuitry (e.g., another variation of the profile 320). For example, the annotations (including the attribute) can be used to optimize the integrated circuit design and generation process, such as by generating measurement data and applying the measurement data to perform optimizations of the circuitry. For example, the integrated circuit generator 304, the IR data structure 306, and/or the RTL data structure 308, when combined with the profile 320 (e.g., information determined from the integrated circuit design, such as observations and/or activations of faults in particular structures of the design) may cause the integrated circuit generator 304, compiler, and/or other tools to change in their generation and/or transformation process to improve the integrated circuit design and included circuitry. In another example, the synthesis tool and/or the place and route tool may use alternative circuitry (e.g., special, fault-resistant cell types) based on the profile 320.

FIG. 6 is a flow chart of an example of a process for marking circuitry having an attribute. The process 600 can be performed, for example, using the systems, hardware, and software described with respect to FIGS. 1-4. The steps, or operations, of the process 600 or another technique, method, process, or algorithm described in connection with the implementations disclosed herein can be implemented directly in hardware, firmware, software executed by hardware, circuitry, or a combination thereof. Further, for simplicity of explanation, although the figures and descriptions herein may include sequences or series of steps or stages, elements of the methods and claims disclosed herein may occur in various orders or concurrently and need not include all of the steps or stages. Additionally, elements of the methods and claims disclosed herein may occur with other elements not explicitly presented and described herein. Furthermore, not all elements of the methods and claims described herein may be required in accordance with this disclosure. Although aspects, features, and elements are described and claimed herein in particular combinations, each aspect, feature, or element may be used and claimed independently or in various combinations with or without other aspects, features, and elements.

At 602, a system may generate an annotation based on an attribute determined in connection with logic, such as a function (e.g., an adder or a data buffer). In some implementations, the logic or function may be between a first function (e.g., an encoder) and a second function (e.g., a decoder) in a first level circuit representation. For example, the integrated circuit design service infrastructure 110 of FIG. 1 may implement the integrated circuit generator 304 of FIG. 3 to determine the attribute in connection with logic between an encoder and a decoder (e.g., the attribute 404 in connection with the logic 412 between the encoder 414 and the decoder 416 of FIG. 4). The integrated circuit generator may then generate the annotation (e.g., the annotation 418) based on the attribute, including when generating the first level circuit representation (e.g., the first level circuit representation 406, such as the IR data structure 306 or the RTL data structure 308).

At 604, the system may identify circuitry in a second level circuit representation corresponding to the logic in the first level circuit representation. For example, the integrated circuit design service infrastructure may implement the system analyzer 316 of FIG. 3 to identify circuitry in a second level circuit representation corresponding to the logic in the first level circuit representation, such as the circuitry 402 in the second level circuit representation 420 of FIG. 4. The second level circuit representation may be generated based on the first level circuit representation. For example, the second level circuit representation could be the netlist 310 or the physical design 312 generated based on the IR data structure 306 or the RTL data structure 308 of FIG. 3. The system analyzer may link the attribute from the first level circuit representation to the circuitry in the second level circuit representation. The system analyzer may mark the circuitry, in the second level circuit representation, as having the attribute. For example, the system analyzer may mark the circuitry in a data structure (e.g., the data structure 318). The circuitry may correspond to wires, transistors, and/or gates resulting from the connection associated with the logic (e.g., the function, such as the adder or the data buffer) between the first function and the second function (e.g., between the encoder and the decoder).

At 606, the system may mark the circuitry, in the second level circuit representation, having the attribute. For example, the system analyzer may mark, in the data structure, the circuitry 402 having the attribute. In some implementations, the system may mark the circuitry by linking the attribute to the circuitry in the netlist, including by marking the indication in the data structure. In some implementations, the system may determine a fault profile of the integrated circuit design based on the marking. As a result, the system may provide a path for identifying the circuitry that includes the attribute.

Figure 7:
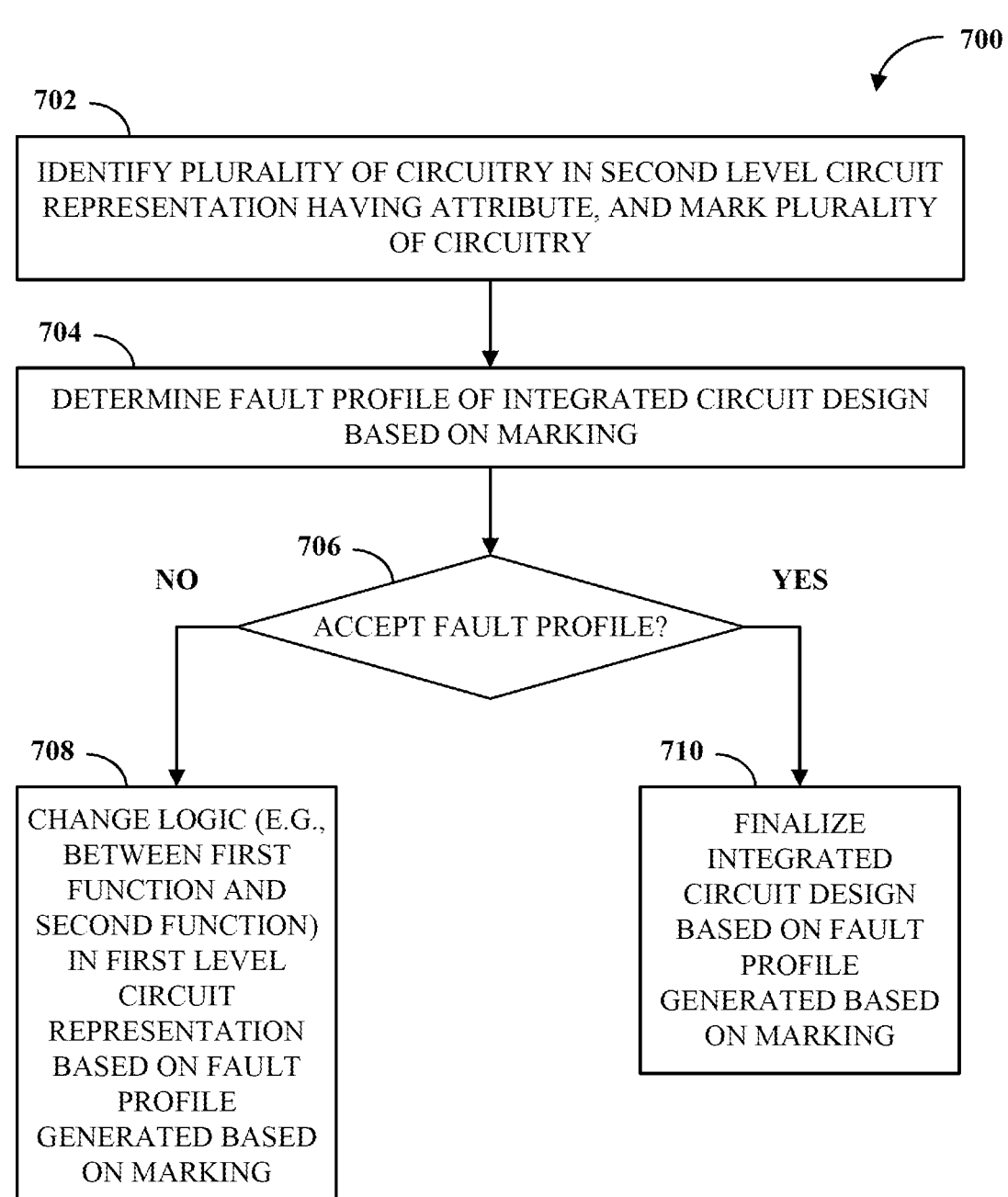
FIG. 7 is a flow chart of an example of a process for changing or finalizing an integrated circuit design based on marking.

FIG. 7 is a flow chart of an example of a process for changing or finalizing an integrated circuit design based on marking. The process 700 can be performed, for example, using the systems, hardware, and software described with respect to FIGS. 1-4. The steps, or operations, of the process 700 or another technique, method, process, or algorithm described in connection with the implementations disclosed herein can be implemented directly in hardware, firmware, software executed by hardware, circuitry, or a combination thereof. For simplicity of explanation, the process 600 is depicted and described herein as a series of steps or operations. However, the steps or operations in accordance with this disclosure can occur in various orders and/or concurrently. Additionally, other steps or operations not presented and described herein may be used. Furthermore, not all illustrated steps or operations may be required to implement a method in accordance with the disclosed subject matter. Moreover, for simplicity of explanation, although the process 600 includes sequences or series of steps or stages, elements of the methods and claims disclosed herein need not include all of the steps or stages.

At 702, a system may identify a plurality of circuitry in a second level circuit representation having the attribute. For example, the integrated circuit design service infrastructure 110 of FIG. 1 may implement the system analyzer 316 of FIG. 3 to identify a plurality of circuitry in the second level circuit representation (e.g., like the circuitry 402) corresponding to a plurality of logic in the first level circuit representation (e.g., like the logic 412) of FIG. 4. The second level circuit representation may be generated based on the first level circuit representation. For example, the second level circuit representation could be the netlist 310 or the physical design 312 generated based on the IR data structure 306 or the RTL data structure 308 of FIG. 3. The system analyzer may link the attribute from the first level circuit representation to the plurality of circuitry in the second level circuit representation. The system may mark the plurality of circuitry, in the second level circuit representation, having the attribute. For example, the system analyzer 316 may mark the plurality of circuitry in the data structure 318. The plurality of circuitry may correspond to wires, transistors, and/or gates resulting from connections associated with logic such as a function (e.g., an adder or a data buffer). In some implementations, the logic or function may be between functions in the first level circuit representation (e.g., between encoders and decoders).

At 704, the system may determine a fault profile of an integrated circuit design based on the marking. For example, the system analyzer may determine a fault profile (e.g., the profile 320) of the integrated circuit design based on the attribute linked to the circuitry. In some implementations, the fault profile may enable determining a FIT rate for the integrated circuit.

At 706, the system may determine whether to accept the fault profile. For example, the integrated circuit design service infrastructure may determine whether to accept the fault profile. If the system does not accept the fault profile ("No"), at 708 the system may change the logic (e.g., between the first function and the second function, such as between the encoder and the decoder) in the first level circuit representation based on the fault profile that is generated based on the marking. For example, the change could be to improve the fault profile, such as by increasing protection of circuitry which may increase the FIT rate. However, if the system does accept the fault profile ("Yes"), at 710 the system may finalize the integrated circuit design based on the fault profile generated based on the marking. For example, finalizing the integrated circuit design may include communicating with the manufacturer server 130 of FIG. 1 to facilitate the manufacture of integrated circuits.

Some implementations may include a method comprising generating an annotation based on an attribute determined in connection with logic, which may be between a first function and a second function (e.g., an encoder and a decoder), in a first level circuit representation; identifying circuitry in a second level circuit representation corresponding to the annotated logic in the first level circuit representation, the second level circuit representation generated based on the first level circuit representation; and marking the identified circuitry, in the second level circuit representation, having the attribute. In some implementations, the method may include determining a fault profile of an integrated circuit design based on the marking. In some implementations, the method may include changing the logic between the encoder and the decoder in the first level circuit representation based on a fault profile generated based on the marking. In some implementations, the method may include identifying a plurality of circuitry in the second level circuit representation having the attribute. In some implementations, a language program generates the first level circuit representation and the annotation. In some implementations, a synthesis tool generates the second level circuit representation, and the circuitry includes at least one of a plurality of transistors or a plurality of gates. In some implementations, the attribute indicates fault protection using at least one of error correction code, parity, or Gray code. In some implementations, the attribute indicates at least one of a power level, a frequency domain, or clock domain.

Some implementations may include an apparatus, comprising a memory and a processor configured to execute instructions stored in the memory to generate an annotation based on an attribute determined in connection with logic, which may be between a first function and a second function (e.g., an encoder and a decoder), in a first level circuit representation; identify circuitry in a second level circuit representation corresponding to the annotated logic in the first level circuit representation, the second level circuit representation generated based on the first level circuit representation; and mark the identified circuitry, in the second level circuit representation, having the attribute. In some implementations, the processor is further configured to execute instructions stored in the memory to determine a fault profile of an integrated circuit design based on the marking. In some implementations, the processor is further configured to execute instructions stored in the memory to change the logic between the encoder and the decoder in the first level circuit representation based on a fault profile generated based on the marking. In some implementations, the processor is further configured to execute instructions stored in the memory to identify a plurality of circuitry in the second level circuit representation having the attribute. In some implementations, the first level circuit representation corresponds to an IR data structure or an RTL data structure. In some implementations, the second level circuit representation corresponds to a netlist. In some implementations, the attribute indicates at least one of a fault protection, a power level, a frequency domain, or clock domain.

Some implementations may include a non-transitory computer readable medium storing instructions operable to cause one or more processors to perform operations comprising generating an annotation based on an attribute determined in connection with logic, which may be between a first function and a second function (e.g., an encoder and a decoder), in a first level circuit representation; identifying circuitry in a second level circuit representation corresponding to the annotated logic in the first level circuit representation, the second level circuit representation generated based on the first level circuit representation; and marking the identified circuitry, in the second level circuit representation, having the attribute. In some implementations, the operations further comprise determining a fault profile of an integrated circuit design based on the marking. In some implementations, the operations further comprise changing the logic between the encoder and the decoder in the first level circuit representation based on a fault profile generated based on the marking. In some implementations, the operations further comprise identifying a plurality of circuitry in the second level circuit representation having the attribute. In some implementations, the first level circuit representation corresponds to an IR data structure or an RTL data structure and the second level circuit representation corresponds to a netlist or a physical design.

As used herein, the term "circuitry" refers to an arrangement of electronic components (e.g., transistors, resistors, capacitors, and/or inductors) that is structured to implement one or more functions. For example, a circuit may include one or more transistors interconnected to form logic gates that collectively implement a logical function. While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures.

What is claimed is:

1. A method comprising:
generating an annotation based on an attribute determined in connection with logic in a first level circuit representation, wherein the annotation is separate from the first level circuit representation;
identifying circuitry in a second level circuit representation corresponding to the logic in the first level circuit representation, the second level circuit representation generated based on the first level circuit representation; and
marking, based on the annotation, the identified circuitry, in the second level circuit representation, having the attribute.

2. The method of claim 1, further comprising:
determining a fault profile of an integrated circuit design based on the marking.

3. The method of claim 1, wherein the logic is between a first function that is an encoder and a second function that is a decoder, and further comprising:
changing the logic between the encoder and the decoder in the first level circuit representation based on a fault profile generated based on the marking.

4. The method of claim 1, further comprising:
identifying a plurality of circuitry in the second level circuit representation having the attribute.

5. The method of claim 1, wherein a language program generates the first level circuit representation and the annotation.

6. The method of claim 1, wherein a synthesis tool generates the second level circuit representation, and the circuitry includes at least one of a plurality of transistors or a plurality of gates.

7. The method of claim 1, wherein the attribute indicates fault protection using at least one of error correction code, parity, or Gray code.

8. The method of claim 1, wherein the attribute indicates at least one of a power level, a frequency domain, or clock domain.

9. An apparatus, comprising:
a memory; and
a processor configured to execute instructions stored in the memory to:
generate an annotation based on an attribute determined in connection with logic in a first level circuit representation, wherein the annotation is separate from the first level circuit representation;
identify circuitry in a second level circuit representation corresponding to the logic in the first level circuit representation, the second level circuit representation generated based on the first level circuit representation; and
mark, based on the annotation, the identified circuitry, in the second level circuit representation, having the attribute.

10. The apparatus of claim 9, wherein the logic is between a first function that is an encoder and a second function that is a decoder, and the processor is further configured to execute instructions stored in the memory to:
change the logic between the encoder and the decoder in the first level circuit representation based on a fault profile generated based on the marking.

11. The apparatus of claim 9, wherein the processor is further configured to execute instructions stored in the memory to:
identify a plurality of circuitry in the second level circuit representation having the attribute.

12. The apparatus of claim 9, wherein the first level circuit representation corresponds to an intermediate representation (IR) data structure.

13. The apparatus of claim 9, wherein the second level circuit representation corresponds to a netlist.

14. The apparatus of claim 9, wherein the attribute indicates fault protection using error correction code.

15. A non-transitory computer readable medium storing instructions operable to cause one or more processors to perform operations comprising:
generating an annotation based on an attribute determined in connection with logic in a first level circuit representation, wherein the annotation is separate from the first level circuit representation;
identifying circuitry in a second level circuit representation corresponding to the logic in the first level circuit representation, the second level circuit representation generated based on the first level circuit representation; and
marking, based on the annotation, the identified circuitry, in the second level circuit representation, having the attribute.

16. The non-transitory computer readable medium storing instructions of claim 15, the operations further comprising:
determining a fault profile of an integrated circuit design based on the marking.

17. The non-transitory computer readable medium storing instructions of claim 15, wherein the logic is between a first function that is an encoder and a second function that is a decoder, the operations further comprising:
changing the logic between the encoder and the decoder in the first level circuit representation based on a fault profile generated based on the marking.

18. The non-transitory computer readable medium storing instructions of claim 15, the operations further comprising:

identifying a plurality of circuitry in the second level circuit representation having the attribute.

19. The non-transitory computer readable medium storing instructions of claim 15, wherein the first level circuit representation corresponds to a register-transfer level (RTL) data structure and the second level circuit representation corresponds to a physical design.

20. The method of claim 1, wherein marking the identified circuitry comprises storing an indication of the attribute linked to the identified circuitry in a data structure.

\*　\*　\*　\*　\*